United States Patent
Arlow

(10) Patent No.: US 6,943,640 B2
(45) Date of Patent: Sep. 13, 2005

(54) CURRENT SOURCE MODULATOR

(75) Inventor: Gregory Alan Arlow, Southampton, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 101 days.

(21) Appl. No.: 10/455,544

(22) Filed: Jun. 5, 2003

(65) Prior Publication Data

US 2004/0183715 A1 Sep. 23, 2004

Related U.S. Application Data

(60) Provisional application No. 60/451,554, filed on Mar. 3, 2003.

(51) Int. Cl.[7] ............................................... H03K 7/00
(52) U.S. Cl. ........................ 332/106; 332/107; 342/202; 342/203; 323/270; 323/271; 340/870.18; 340/870.19
(58) Field of Search ................................ 332/106, 107, 332/109; 342/202, 203, 82; 323/270, 271, 282, 222; 340/870.18, 870.19; 307/77; 327/175

(56) References Cited

U.S. PATENT DOCUMENTS 5,942,810 A * 8/1999 Jisland et al. ................. 307/44
6,456,050 B1 * 9/2002 Agiman ...................... 323/282

* cited by examiner

*Primary Examiner*—Arnold Kinkead
(74) *Attorney, Agent, or Firm*—Duane Morris LLP

(57) ABSTRACT

A current source modulator (202; 302, 502) provides power to radar transmitters. The modulator comprises a power supply (210, 310, 510) providing, when enabled, a known current to a storage capacitor (145). A comparator circuit (220) provides a signal (V220) when voltage ($V_C$) across the storage capacitor (145) falls a reference voltage, and an enable circuit (225) responds to the comparator signal (V220) and an ON command signal to enable the power supply (210, 310, 510). The modulator (202, 302, 502) further includes a network (220N) associated with the comparator circuit (220) to retain the value of the signal (provide hysteresis) when the voltage across the storage capacitor is above the reference voltage. The modulator (202, 302, 502) may include a second network (320N) associated with a second comparator circuit, operable to retain a second signal when capacitor (145) voltage $V_C$ is above a reference voltage. In this aspect, there is a rapid charge and a trickle charge that reduces any charging overshoot.

15 Claims, 7 Drawing Sheets

| PARAMETER | VALUE | UNITS | NOTES |
|---|---|---|---|
| RF DUTY | 25% | | ASSUMPTION |
| Ipeak | 75 | AMPS | ASSUMED PEAK LOAD CURRENT |
| Tpw | 1.00E-03 | SEC | RF PULSE WIDTH |
| Ipp | 3.00E-03 | SEC | INTERPULSE PERIOD = TPW/(RF DUTY)-Tpw |
| C | 0.15 | FARADS | STORAGE CAPACITANCE |
| Vcpeak | 10.00 | VOLTS | LOAD PEAK VOLTAGE |
| ΔV | 0.50 | VOLTS | VOLTAGE DROOP = Ipeak*Tpw/C |
| Vtrickle | 9.99 | VOLTS | SET BY REFERENCE DIVIDER |
| Qc total | 7.50E-02 | COULOMBS | TOTAL CHARGE REMOVED = C*ΔV, OR Ipeak*Tpw |
| Qc rapid | 7.35E-02 | COULOMBS | CHARGE REPLACED BY RAPID CHARGE = C*{ΔV-(Vcpeak-Vtrickle)} |
| Qc trickle | 1.50E-03 | COULOMBS | CHARGE REPLACED BY TRICKLE MODE = C*(Vcpeak-Vtrickle) |
| Ips rapid | 35.00 | AMPS | ASSUMED POWER SUPPLY CURRENT |
| Ips trickle | 3.50 | AMPS | 1/10 of Ips RAPID SET BY DIVIDER ON CURRENT SENSOR |
| trapid | 2.10E-03 | SEC | RAPID RECHARGE TIME = Qc RAPID/Ips RAPID |
| ttrickle | 4.29E-04 | SEC | TRICKLE RECHARGE TIME = Qc TRICKLE/Ips TRICKLE |
| TIME TO SPARE | 4.71E-04 | SEC | TIME LEFT OVER = Ipp - (trapid + trickle) |
| fps | 500.00 | kHz | POWER SUPPLY SWITCHING FREQUENCY |
| ΔQerror | 7.00E-06 | COULOMBS | CHARGING ERROR = 1 CYCLE OF fps @ Ips TRICKLE |
| ΔVerror | 4.67E-05 | VOLTS | THEORETICAL PULSE TO PULSE VOLTAGE ERROR = ΔQerror/C |

CURRENT SOURCE MODULATOR

CROSS-REFERENCE TO RELATED APPLICATIONS

This application claims the benefit, pursuant to 35 USC 119, of the filing date of U.S. Provisional Patent Application Ser. No. 60/451,554, entitled "Current Source Modulator," filed on Mar. 3, 2003, which is incorporated by reference herein.

FIELD OF THE INVENTION

This application is related to the field of radar and, more specifically, to radar pulse transmit amplifiers.

BACKGROUND OF THE INVENTION

Radar systems are known to require the generation of high-power signals over a short time period. One method for supplying the energy for generating a high-power pulse is to retain energy in a storage capacitor, and rapidly discharge the capacitor to provide the energy necessary to generate the radar pulse. This method meets the requirement of providing high-power energy to the pulse generator over a short period of time. Variations in load current from pulse to pulse result in a varying voltage drop in the unavoidable circuit and component "parasitic" resistances lying between the voltage source and the pulse generator. In order for the pulse generator to receive a substantially constant voltage during the pulse in the presence of such resistances, it is desirable to maintain a substantially constant load, i.e., a constant number of RF (radio frequency) amplifier loads pulsed at relatively constant rates. However, as the load becomes dynamic (for example, load changes associated with waveform diversity or pulse-to-pulse frequency diversity), parasitic resistance effects between the power supply output and the storage capacitor begin to impact the pulse-to-pulse voltage applied to the capacitor, and therefore to the pulse generating transmitting amplifiers. These parasitic resistance effects arise from the resistance effects of the power supply output filter and also from bus traces leading from the power supply to the output filter, and from the output filter to the storage capacitor. Modern radar systems often use low voltage, high-power Gallium Arsenide (GaAs) Field Effect Transistor (FET) amplifiers, that typically operate with a relatively low 10 vDC drain voltage bias input. Even relatively small parasitic resistance effects can produce pulse-to-pulse voltage variations which are significant as a percentage of the bias voltage. In some cases, the parasitic resistances can result in as much as a six percent (6%) voltage variation. Voltage variations of this magnitude can cause significant degradation of radar Clutter Improvement Factor (CIF), and can have impacts on calibration. These degradations and impacts arise due to voltage-dependent phase and amplitude changes in the pulses generated by the pulse transmit amplifiers.

Numerous techniques can be used to mitigate the CIF and calibration impacts. For example, larger copper conductors (having greater cross-sectional area and consequently lower resistance) can be used. The larger conductors, and increases in the size of magnetic cores on which such conductors are wound all contribute to increases in the size and weight of the power supply, and have adverse cost impact. One known method for tending to reduce the effects of parasitic resistance is to use degenerative feedback, using a remote sensing connection of the power supply to the storage capacitor, thereby including the parasitic resistances within the feedback loop. This technique, however, undesirably tends to introduce a low frequency pole into the power control loop, which in turn negatively impacts loop roll-off and AC line frequency suppression. Linear (non-switching or dissipative) regulation at the storage capacitor or at the RF amplifier power input can regulate out the parasitic resistance effect, thereby potentially eliminating droop of the power supply output pulse applied to the radar pulse transmit amplifiers. However, such regulation has a negative impact to the size, weight, cost and efficiency of the supply. Typically, an additional ten percent (10%) power system efficiency degradation occurs when linear regulation is used with a conventional 10VDC GaAS FET transmit amplifier. Furthermore, such regulation requires the use of a relatively large number of pulses with constant pulse width and duty cycle in the coherent processing interval (CPI) to afford relatively constant average power delivery during CPI intervals.

Hence, there is a need for a power supply that provides enhanced pulse and intra-pulse voltage regulation for diverse loads and waveform requirements for radar pulse transmit amplifiers

SUMMARY OF THE INVENTION

A current source modulator for providing power to radar transmitters is disclosed. The modulator comprises a power supply operable to provide a known current to a storage capacitor when enabled. A comparator circuit is operable to provide a signal when a voltage across the storage capacitor is determined to be below a reference voltage; and an enable circuit is operable to receive the comparator signal and the command signal and provide an enable signal to the power supply. The modulator further comprises a network associated with the comparator operable to retain the value of the signal when the voltage across the storage capacitor is above the reference voltage. In another aspect of the invention, the modulator includes a second network associated with a second comparator circuit operable to retain a second signal when the voltage across said storage capacitor is above the reference voltage. In this aspect, there is a rapid charge and a trickle charge that reduces any charging overshoot.

BRIEF DESCRIPTION OF THE DRAWINGS

FIG. 1b illustrates simplified amplitude-versus-time voltage and current waveforms which may be associated with the arrangement of FIG. 1a;

FIG. 2b illustrates simplified amplitude-versus-time voltage, current and control waveforms associated with the modulator shown in FIG. 2a;

FIG. 3b illustrates exemplary voltage, current and command waveforms associated with the modulator shown in FIG. 3a;

FIG. 4b is a table illustrating component values in accordance with an aspect of the present invention; and FIG. 5 illustrates a second aspect of the embodiment shown in FIG. 3a.

DESCRIPTION OF THE INVENTION

Figure 1A:
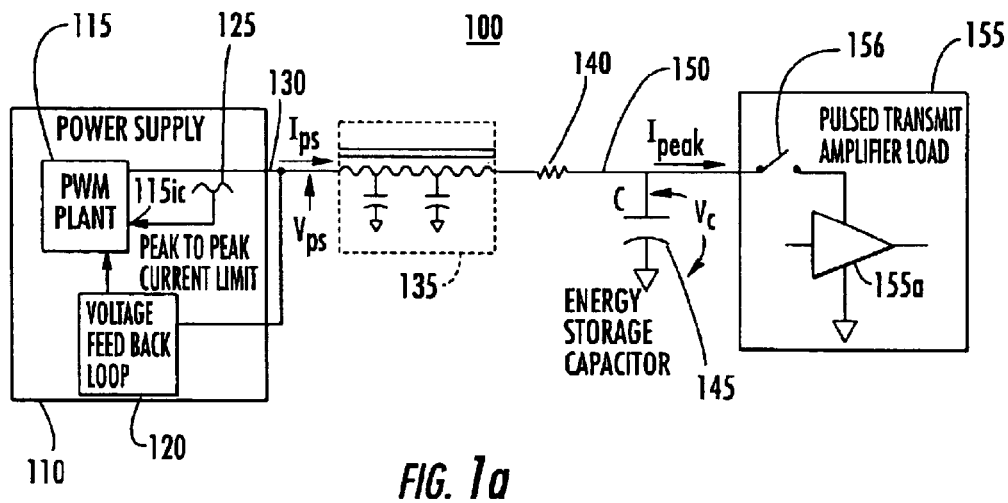
FIG. 1a is a simplified diagram, in block and schematic form, illustrating a conventional voltage source and pulse generator.

It is to be understood that these drawings are solely for purposes of illustrating the concepts of the invention and are not intended as a definition of the limits of the invention. The embodiments shown in FIGS. 2a through 5 and described in the accompanying detailed description are to be used as illustrative embodiments and should not be construed as the only manner of practicing the invention. Also, the same reference numerals, possibly supplemented with reference characters where appropriate, have been used to identify similar elements.

Figure 1B:
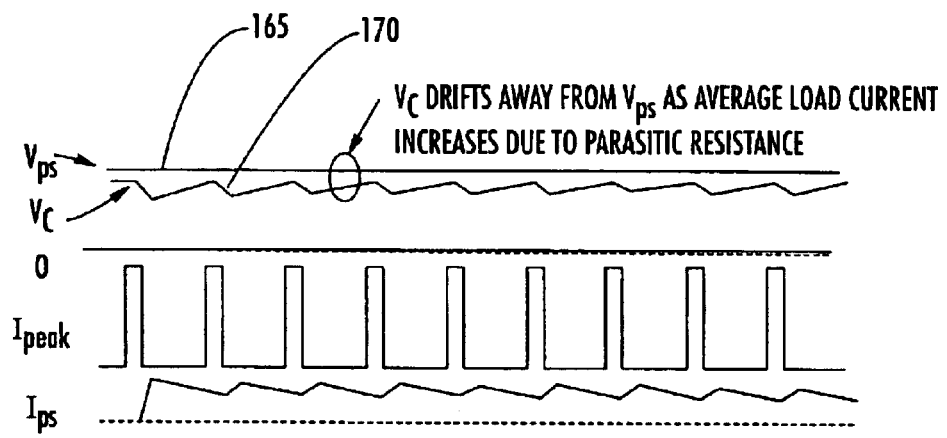

FIG. 1a is a simplified circuit diagram illustrating a conventional power supply and radar pulse transmit amplifier, designated together as an arrangement 100. In this example of a conventional power-supply/amplifier 100, power supply 110 includes a pulse-width-modulated power supply 115 which produces output current designated as $I_{ps}$ on an output conductor 130. Current $I_{ps}$ is illustrated in FIG. 1b as a somewhat sawtooth-shaped waveform. The voltage of the output of power supply 110 is regulated by a voltage feedback loop illustrated as a block 120. Pulse-width-modulator current source 115 includes a current limit input port 115ic. A current sensor designated 125 is coupled to the output conductor of power supply 110, and produces a signal which is related to the magnitude of current flow $I_{ps}$. When the current regulator is active, the voltage-regulated constant voltage supply including pulse-width-modulator 115 and feedback loop 120 applies a fixed or known current ($I_{ps}$) on conductor 130 to an inductor/capacitor filter circuit 135. Inductor/capacitor circuit 135 operates as a multi-pole filter to smooth current ($I_{ps}$) on conductor 130 to an average value. The averaged current ($I_{ps}$) on conductor 130 is applied, by way of a resistance illustrated as a resistor 140, to energy storage capacitor 145. Resistance 140 represents the resistance of the inductive components of filter 135 and of conducive lead traces. Energy storage capacitor 145 stores the current flow as a charge until a pulse is to be transmitted. The stored charge in capacitor 145 results in a voltage $V_C$ thereacross. The value of storage capacitor 145 is selected, as is known in the art, to maintain the voltage droop occurring during the transmitted pulse (during the pulse width) to known and tolerable levels.

A transmit pulse is generated in FIG. 1a when switch 156, located in load 155, is engaged, closed, or rendered conductive. When switch 156 is conductive, current $I_{peak}$ is drawn from the charge stored in capacitor 145 and over a conductor 150 to the amplifier or amplifiers, illustrated as 155a. The voltage across capacitor 145 is indicated in FIG. 1a as voltage $V_c$, and is also illustrated in FIG. 1b as a waveform 17

Pulse width modulator (PWM) 115 within power supply 110 of FIG. 1a, in association with voltage feedback loop 120, produces a voltage at a controlled level. In this example, power supply output voltage $V_{ps}$ is produced at the output terminal power supply 110 relative to ground (zero voltage). A sensor 125 senses the output current of power supply 115, and applies the resulting signal to a current-limit input port 115i of PWM 115 to limit the peak output current $I_{ps}$ drawn from power supply 110.

FIG. 1b illustrates voltage and current waveforms associated with the circuit diagram shown in FIG. 1a. $V_{ps}$ is represented in FIG. 1b as a constant voltage level 165 with respect to a zero (0) voltage level. Storage capacitor 145 voltage $V_c$ 170 is illustrated in FIG. 1b as being slightly lower than voltage $V_{ps}$ 165, because of parasitic resistance represented by resistance 140 of FIG. 1a. A ripple or sawtooth-shaped variation of voltage, created by the drawing of current $I_{peak}$ 150 from capacitor 145 when switch 156 is closed, and the subsequent re-charging of capacitor 145, is imposed on voltage $V_c$ 170. As those skilled in the art will understand, switch 156 is closed for a known period at a known rate based on the desired width and rate, respectively, of the radar transmit pulse. The decreasing portion of the ripple of voltage $V_c$ 170 across capacitor 145 which is illustrated in FIG. 1b results as energy is drawn from capacitor 145 of FIG. 1a in the form of current $I_{peak}$ 150 of FIG. 1b, and the rising portion of the ripple of voltage $V_C$ of FIG. 1b represents the replenishment of the energy from voltage $V_{ps}$ 165 of power supply 110 of FIG. 1a. To maintain voltage $V_c$ 170 at a substantially constant level, current $I_{ps}$ of FIG. 1b is initially drawn from power supply 110 on conductor 130 at a maximum value and decreases as capacitor voltage $V_c$ 170 is achieved.

Figure 2A:
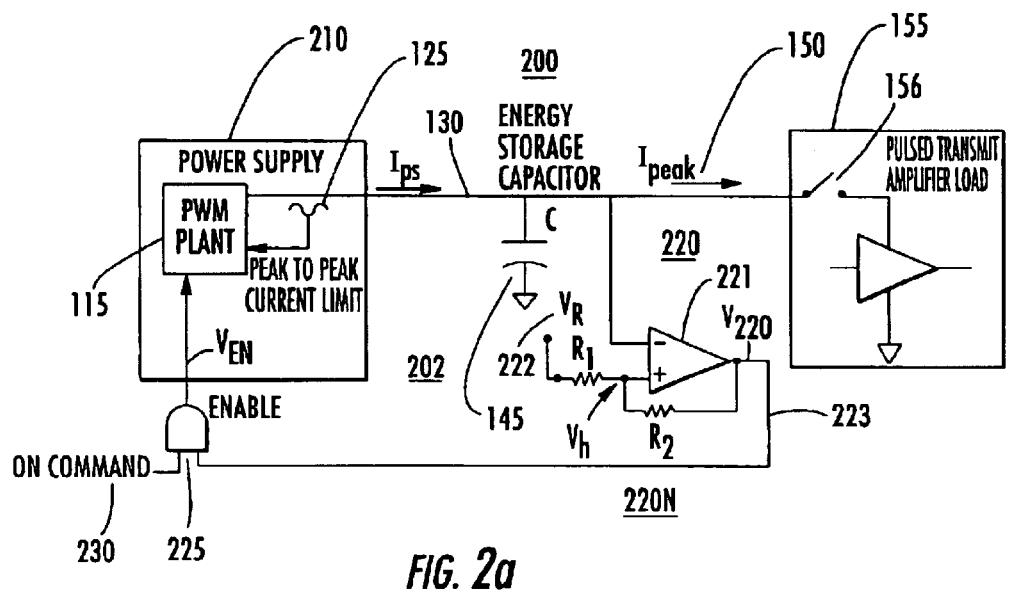
FIG. 2a is a simplified block and schematic diagram illustrating a first embodiment of a current source modulator in accordance with the principles of the invention.

FIG. 2a illustrates an exemplary embodiment of a power supply and radar pulse transmit amplifier, designated together as an arrangement 200, which includes a current source modulator 202 in accordance with the principles of the present invention. Current source modulator 202 includes a power supply 210, a comparator 220, and an enable circuit 225. In this embodiment, power supply 210 includes PWM 115 and current limiter sensor 125, as previously described, and need not be discussed in detail. In the embodiment of FIG. 2a, rather than constantly providing an output voltage, PWM 115 is selected, activated or enabled by an enable circuit, represented as AND gate 225. Thus, the output voltage and current $I_{ps}$ of power supply 210 can be turned ON and OFF by enable circuit 225. The inputs to enable circuit 225 include (a) a simple On Command control signal applied on to an input port of enable circuit 225 by way of a conductor 230 and (b) the output signal $V_{220}$ of a comparator circuit 220, applied to an input port of enable circuit 225 by way of a conductor 223. The On Command signal and the comparator circuit output signal $V_{220}$ are separately illustrated in FIG. 2b, together with the resulting coincidence or power supply enable signal $V_{en}$ produced by enable circuit 225 of FIG. 2a. The logically active (high portion in this example) of $V_{en}$ corresponds to those times during which power supply current $I_{ps}$ flows.

PWM 115 of FIG. 2a, accordingly, provides an output current $I_{ps}$ on conductor 130 during those times in which both command line 230 and comparator circuit 220 output line 223 are logically active. Current $I_{ps}$ on conductor 130, as previously discussed, is provided to energy storage capacitor 145 until the capacitor voltage $V_c$ (170 of FIG. 2b) is substantially the same as the voltage $V_{ps}$ 165 of FIG. 1b. Comparator circuit 220 of FIG. 2a includes comparator 221, and also includes a resistive network including a resistor R1 connected between a second input port 222 of comparator circuit 220 and the noninverting (+) input port of comparator. The resistive network also includes a further regenerative feedback resistor R2 connected to the output terminal of comparator 221 and the noninverting input port. Voltage $V_c$ (170 of FIG. 2b) is further provided to the inverting (−) input port of comparator 221 of comparator circuit 220, while a known reference voltage $V_r$ 222 is applied to second input port 222 of comparator circuit 220. In one aspect of the invention, reference voltage $V_r$ applied to port 222 is substantially the same as capacitor voltage $V_c$ (170 of FIG. 2b).

In the arrangement of FIG. 2a, comparator output V220 on conductor 223 is maintained in a non-active state, e.g., logical low, when voltage ($V_c$) (170 of FIG. 2b) is greater than a reference voltage $V_h$ measured at the noninverting (+) input port of comparator 221, and takes on an active state, e.g., logic high, when capacitor voltage $V_c$ (170 of FIG. 2b) is less than reference voltage $V_h$. Reference voltage $V_h$ is designated by the numeral 275 in FIG. 2b.

Figure 2B:
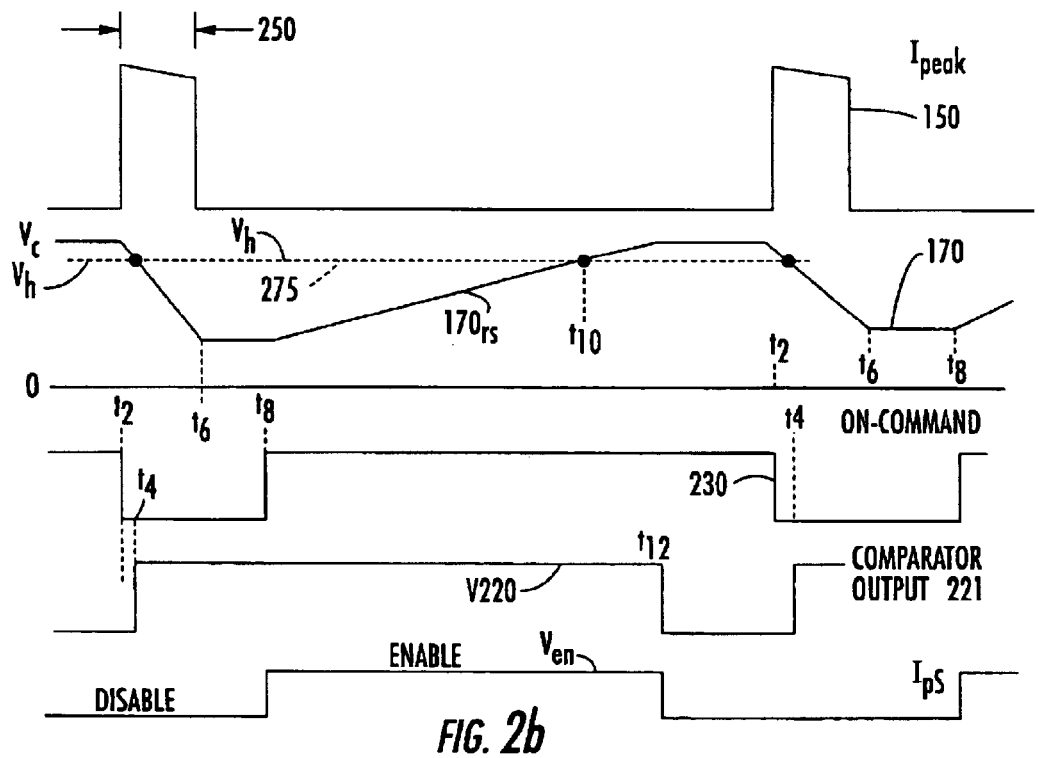

The operation of the arrangement 200 of FIG. 2a can be explained with the aid of the exemplary voltage and current waveforms shown in FIG. 2b. In FIG. 2b, current $I_{peak}$ 150 is drawn from capacitor 145 during those intervals in which switch 156 of FIG. 2a is closed. In the case of a radar system, the switch is closed for a known duration illustrated as the interval t2–t6 in FIG. 2b (the time interval 250). These switch closure periods ordinarily recur at a pulse repetition rate. Concurrently, with a pulse, capacitor 145 discharges and voltage $V_c$ of FIG. 2a decreases, as illustrated by waveform 170 of FIG. 2b, from a value substantially equal to voltage $V_{ps}$ (165 of FIG. 1b). The magnitude of the decrease in voltage $V_c$ 170 is determined by the time duration that switch 156 is closed, which in the example of FIG. 2b is the interval t2–t6. When voltage $V_c$ 170 falls below voltage $V_h$ 275 at recurrent locations designated 223 in FIG. 2b, output voltage $V_{220}$ of comparator 220, in this illustrated case, transitions from a logically inactive state to a logically active state.

On-Command signal applied to path 230 of FIG. 2a recurs at a rate substantially equal to the desired pulse repetition rate. The On-Command signal is held in a logically inactive (logic low) state for a fixed period of time that includes the duration of each pulse $I_{peak}$, represented by waveform 150 of FIG. 2b. In this illustrated example, On-Command signal 230 is held at a logical inactive level beginning substantially at the beginning of pulse $I_{peak}$ 150 at time t2, and is held inactive for a period t2–t8 which is greater than that during which current is drawn from capacitor 145, i.e., the period t2–t6. Maintaining the On-Command signal applied to conductor 230 of FIG. 2a logically inactive during the period in which load current is drawn from capacitor 145 is advantageous from the point of view of reducing the effects of power supply noise on the transmitted pulse. Holding the On-Command signal logic low disables the power supply 210 during the time that load 155 current is drawn from the capacitor 145 (corresponding to the time interval 250 of FIG. 1b), and therefore decouples the power supply from the capacitor (and the load) during the transmit pulse. Any noise generated in the power supply, then, does not enter the load, at least by a direct path. Put another way, the disabling of the power supply 210 prevents current $I_{ps}$ drawn from power supply 210 from flowing over path 130 to capacitor 145 while current is drawn from capacitor 145.

When the on-command signal applied to conductor 230 of FIG. 2a is returned to a logically active state, near time t8 of FIG. 2b, enable circuit 225 provides an enable signal to PWM 115 to enable it to produce output current $I_{ps}$ on path 130, which charges storage capacitor 145. The charging of capacitor 145 occurs during a time interval, namely t8 to t12 of FIG. 2b, in which current is not drawn from capacitor 145 by the switched load 155.

As capacitor 145 of FIG. 2a recharges, its voltage $V_c$, 170 of FIG. 2b, progressively increases with time, as represented by the positive or rising slope 170rs. The voltage $V_c$ of capacitor 145 of FIG. 2a, as represented by voltage waveform 170 of FIG. 2b, will eventually return to, and exceed, the value of voltage ($V_h$), 275 of FIG. 2b. When voltage $V_c$ is equal to or exceeds voltage ($V_h$) 275, output voltage $V_{220}$ on conductor 223 might be expected to return to a logical inactive state. However, resistors R1 and R2 provide sufficient positive feedback or hysteresis to maintain output 223 inactive until the On-Command signal applied to conductor 230 goes to a logical inactive state at time t2, prior to load 155 drawing current $I_{peak}$ 150 again. As known in the art, $V_h$ may be calculated as:

$$V_h = V_r X \left( \frac{R_2}{R_1 + R_2} \right) \quad 1$$

when output 223 is zero.

Figure 3A:
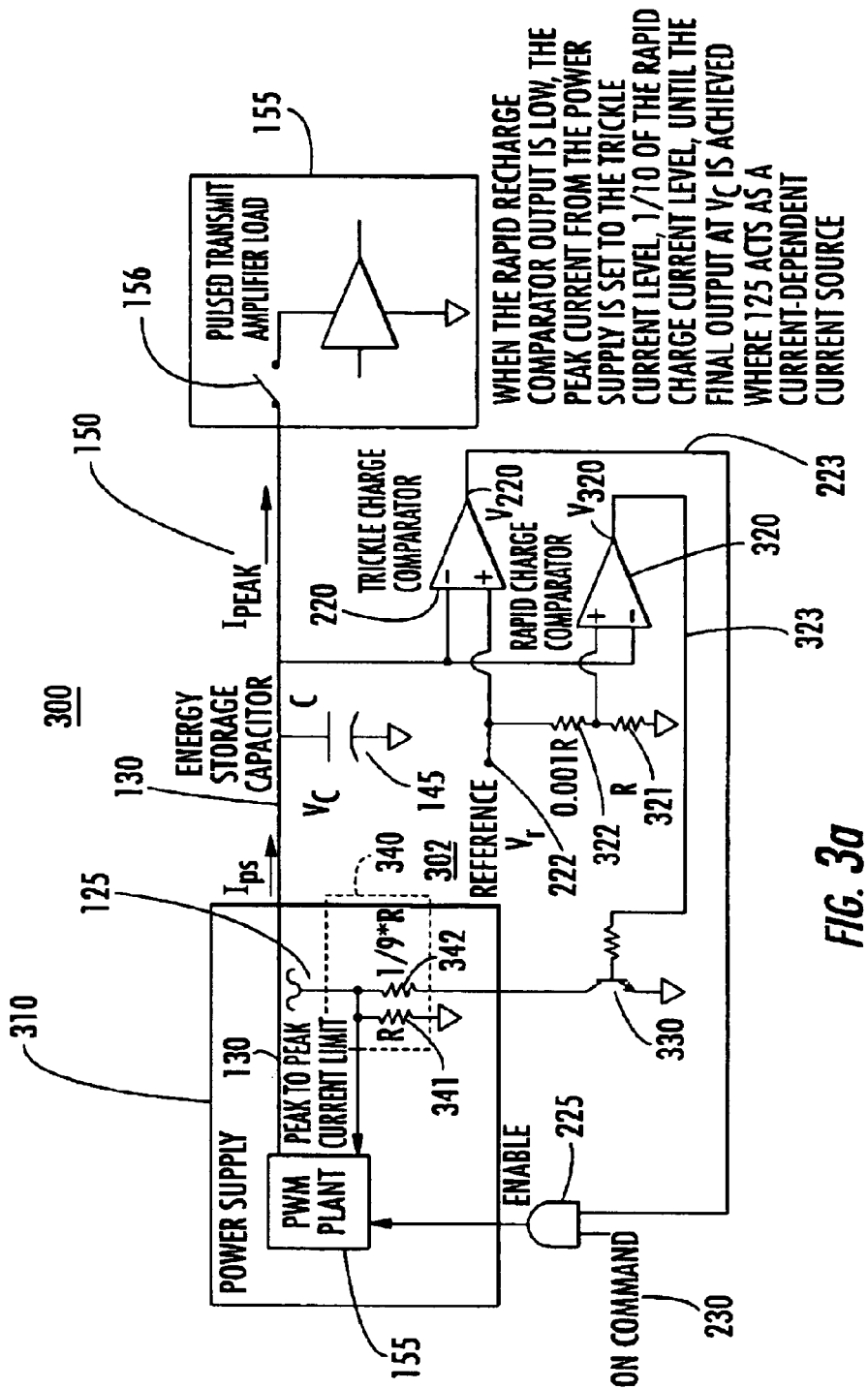
FIG. 3a is a simplified diagram in block and schematic form illustrating a second embodiment of a current source modulator in accordance with the principles of the present invention.

FIG. 3a illustrates a second, and preferred, embodiment 300 of the present invention. In this embodiment, comparator 220 of current source modulator 302 is used to control PWM 155 to an ON or OFF state, as in the arrangement of FIG. 2a. When enabled, power supply 155 is capable of producing a "trickle" charge or low charging rate to capacitor 145, and is also capable of producing a rapid or full-current charge. Comparator 320 is used to control the rate of charge of PWM 155. In the embodiment of FIG. 3a, trickle charge comparator 220 operates in a manner similar to that discussed with regard to comparator 220 in FIGS. 2a and 2b, except that it lacks a hysteresis-producing resistance network. The reference voltage $V_{ref}$ is applied directly to the noninverting (+) input port of comparator 220 by way of terminal 222 of FIG. 3a.

The operation of rapid charge comparator 320 of current source modulator 302 of FIG. 3a is similar to that of comparator 220, but its operation is established by a tapped voltage dividing resistor network comprising resistors 321 and 322. In this illustrated case, the values of resistors 321 and 322 are selected so that the voltage applied to comparator 320 is approximately 99.9 percent of voltage $V_r$ applied to reference voltage terminal 222. In this case, the output of trickle comparator 320 transitions from a logical active state to a logical inactive state, when the voltage $V_c$ 170 is greater than a known percent of voltage ($V_r$) 222, where the known percentage is established by the voltage division ratio of resistors 321 and 322.

In the preferred embodiment of FIG. 3a, the output of rapid charge comparator 320 is provided to the base of a transistor 330 to control the conduction state of transistor 330. Transistor 330 controls a network 340 that is used to determine the peak output current $I_{ps}$ on conductor 130. In this preferred embodiment, network 340 is composed of two parallel resistors 341, 342, having relative resistances of R and R/9, respectively. Network 340 exhibits a resistance value of R when transistor 330 is in an OFF or nonconducting state and exhibits a resistance value of one-tenth ($\frac{1}{10}^{th}$) R when transistor 330 is in an ON or conducting state. The use of network 340 is advantageous as it reduces the output current ($I_{ps}$) 130 of PWM 115 to a lower level so that precise pulse-to-pulse regulation is achieved.

In the preferred embodiment of the present invention illustrated in FIG. 3a, rapid charge comparator 320 is used to modulate the power supply current so that trickle charging occurs at, in this case, one-tenth ($\frac{1}{10}^{th}$) the rate of charging during the rapid charge mode until a time at which comparator 220 triggers and its output voltage V220 goes to a logic low level and disables power supply 310.

Although not shown, it should be appreciated that a feedback network, similar to the network of resistors 250, 252, shown in FIG. 2a, is associated with comparators 220 and 320 to provide sufficient hysterias to maintain output 232, 323, respectively, logically inactive when a desired voltage ($V_c$) 170 is achieved.

Figure 3B:
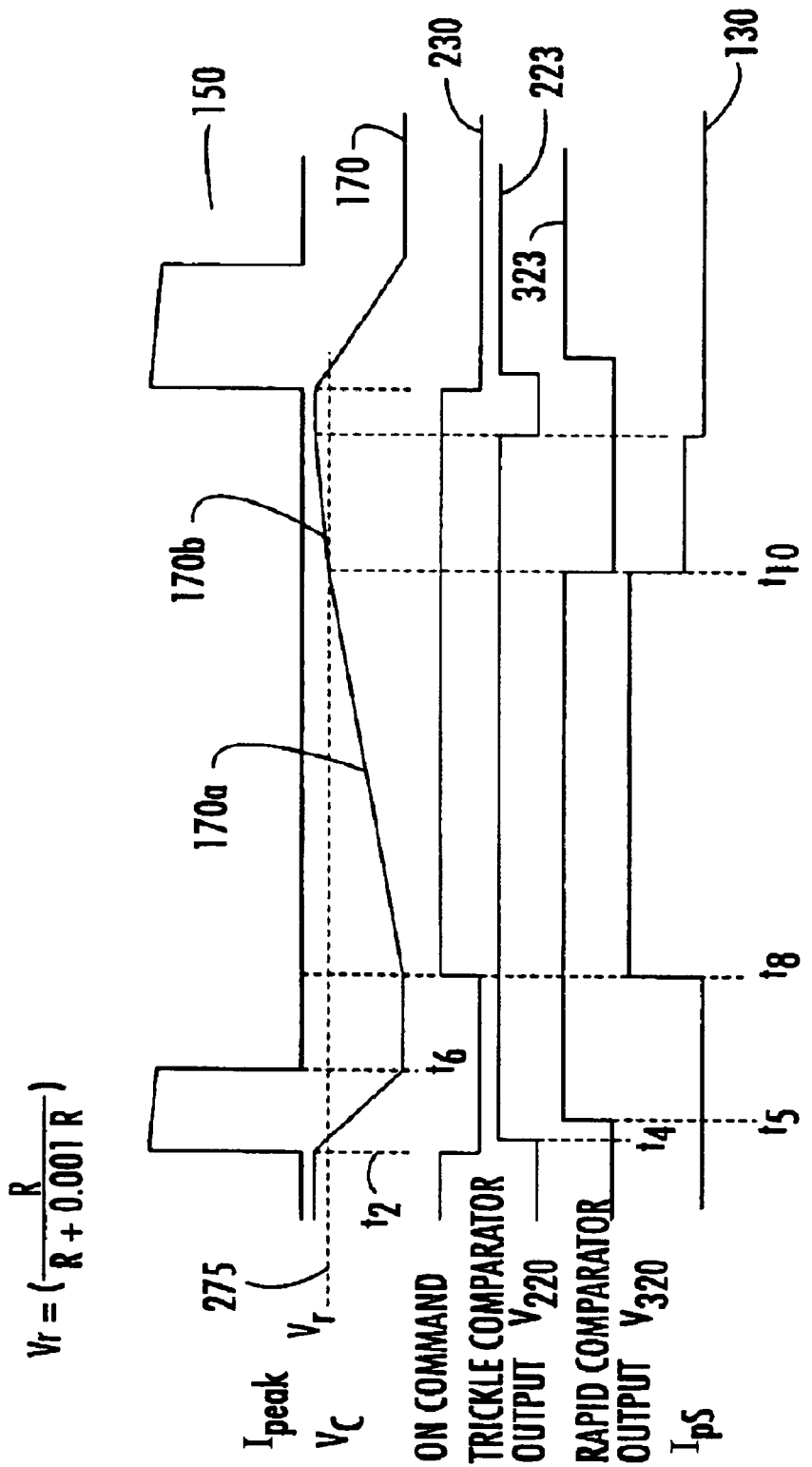

FIG. 3b illustrates voltage and current waveforms for the embodiment of the invention shown in FIG. 3a. In this case, the On-Command signal (230 of FIG. 3b) transitions from an active state to an inactive state at a recurrent time illustrated as t2, substantially concurrently with the beginning of transmission of a radar pulse, as represented by the positive-going portion of pulse $I_{peak}$ 150. Maintaining on-command 230 in an inactive state during pulse $I_{peak}$ 150 is advantageous as it disables PWM 115 during the pulse transmission period.

During the transmission of pulse $I_{peak}$ 150 in the interval t2–t6, storage capacitor 145 voltage $V_c$ (170 of FIG. 3b) decreases as energy is drawn from storage capacitor 145 (FIG. 3a), as previously discussed. When the value of voltage $V_c$ 170 falls below voltage $V_h$ 275 near a time t4 of FIG. 3b, output voltage $V_{220}$ of comparator 220 (223 of FIG. 3b) transitions from an inactive to an active state. As voltage $V_c$ 170 of FIG. 3b further decreases and falls below a known level of reference voltage $(V_r)$ 222 near a time t5, output voltage V320 of comparator 320 (323 of FIG. 3b) transitions from an inactive to an active state, thereby turning ON (rendering conductive) transistor 330 of FIG. 3a. When transistor 330 is turned ON, network 340 presents a resistance value of R/10 to current sensor 125. Current sensor 125 is a current-dependent current (high impedance) source. At a time illustrated in FIG. 3b as t8, occurring at a known time after the beginning of each pulse 150 of FIG. 3b, greater than the time duration of pulse $I_{peak}$ 150, the On Command signal 230 is returned to an active state and, as both on-command 230 and comparator 220 output 223 are active, PWM 115 of FIG. 3a is enabled to produce output current $I_{ps}$ (130 of FIG. 3b). Voltage $V_c$, as illustrated by rising plot portion 170a, rises until a time illustrated as t10, at which time rapid charge comparator 320 of FIG. 3a triggers at a known level of $V_r$ 222, and sets the output voltage $V_{320}$ (323 of FIG. 3b) to an inactive logic level, illustrated as a logic LOW level. In the illustrated embodiment, rapid charge comparator 320 fires at 99.9% of the value of $V_r$ 222, i.e., $V_h$=99.9% of $V_r$.

When voltage $V_c$ 170 exceeds the value of reference voltage $V_h$ 275 at a time near time t10, the output 323 of rapid charger comparator 320 transitions to an inactive state and causes transistor 220 to cause network 340 to exhibit a resistance of R. The output $I_{ps}$ 130 of PWM 115 is then limited to one-tenth ($\frac{1}{10}^{th}$) the trickle charge level.

The power supply recharge function may then be determined as:

$$I_{peak} = C \frac{\Delta V}{t_{pw}} \qquad 2$$

$$Q_x = C\Delta V \qquad 3$$

$$Q_x = I_{ps} * t_{ppw} \qquad 4$$

where:
$I_{peak}$ is the current drawn from capacitor 145;
C is the value, in farads, of capacitor 145;
$\Delta V$ is the change in voltage appearing across capacitor 145 during $t_{pw}$;
$t_{pw}$ is the time duration of the current $I_{peak}$;
$Q_x$ is the value, in Coulombs, of charge removed from capacitor 145 during $t_{pw}$; and
$t_{ppW}$ is the time between pulses of current $I_{peak}$ used to refresh charge removed from capacitor 145 by a prior $I_{peak}$ draw.

Figure 4A:
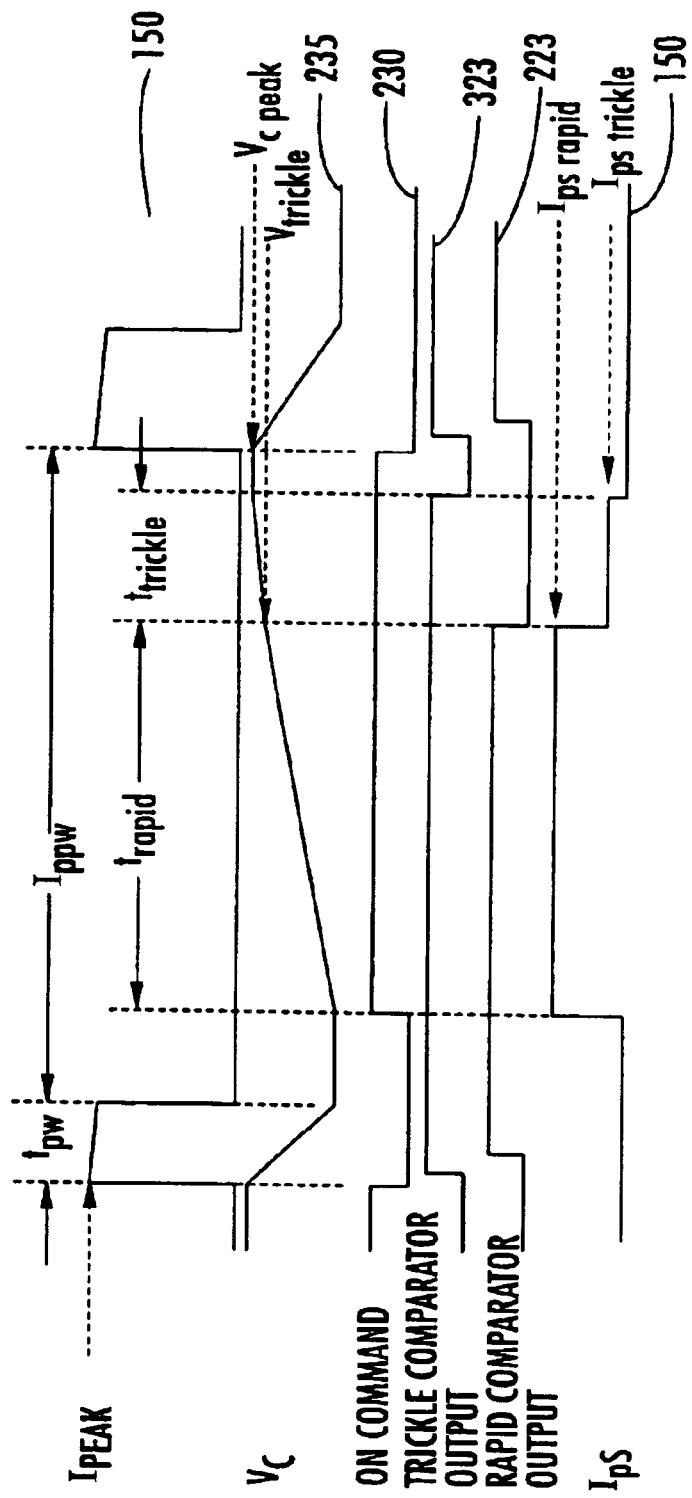
FIG. 4a defines certain parameters.

FIG. 4a illustrates exemplary voltage and current waveforms of the arrangement of FIG. 3a and more clearly depicts the time relations among the illustrated voltages and current waveforms in accordance with the principles of the invention. FIG. 4b tabulates results of a process for determining exemplary parameters associated with the system shown in FIG. 3a using Equations 1, 2 and 3. In this case, an RF duty cycle of 25 percent and a peak current draw of 75 amperes is assumed.

Accordingly, implementation of the capacitor recharge function in accordance with the principles of the invention is accomplished by enabling the capacitor charging power supply at a fixed time prior to the transmission of a next pulse, based on the duration of the prior pulse, i.e., pulse width, and the maximum peak load current anticipated to be drawn. Power supply 110 output current 130 is modulated off by sensing the desired peak voltage achieved prior to the onset of the transmission of a next load pulse.

Figure 5:
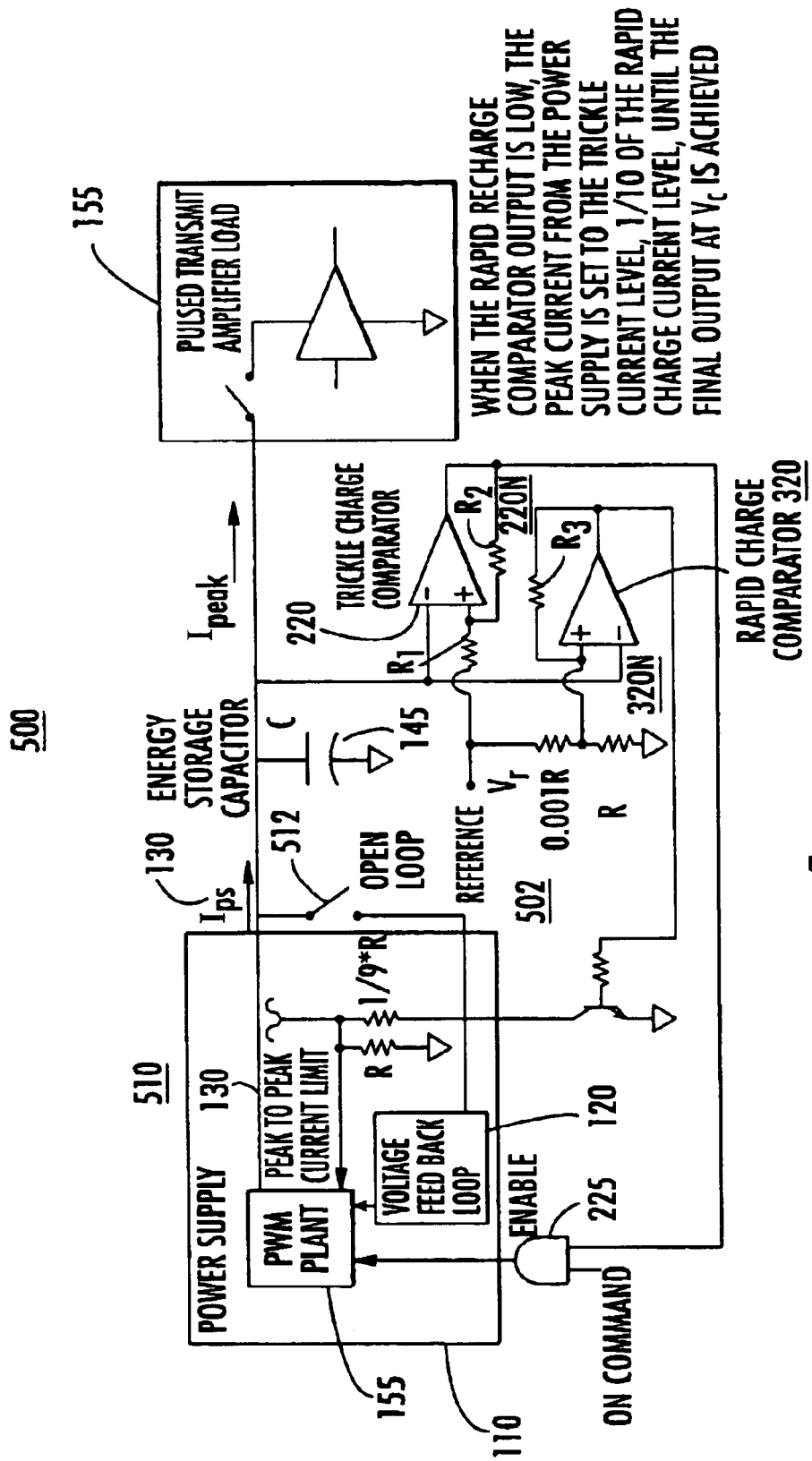

FIG. 5 illustrates another exemplary embodiment 500 of the present invention. In this embodiment, current source modulator 502 includes a voltage regulator circuit 120 to allow operation similar to that shown in FIG. 1a, and discussed with regard thereto. A feedback loop enable switch 510 is operable to allow power supply 110 to operate as a constant voltage source when closed or as a constant current source when open. In one aspect, switch 510 may be left in a closed state to enable constant voltage operation, similar to that shown in FIG. 1a. In another aspect, switch 510 may be left in an open state to enable constant current operation, similar to that shown in FIGS. 2a and 3a.

Also in FIG. 5, current source modulator 502 includes a trickle charge comparator 220. Comparator 220 includes positive- or regenerative-feedback resistor R2, which coacts with input resistor R1 to provide hysteresis, as described in conjunction with FIG. 2a. Output voltage V220 of comparator 220 switches at a value of Vc given by $$V_C = V_r \left( \frac{R1 + R2}{R} 1 \right) \qquad 5$$

Rapid charge comparator 320 includes a positive- or regenerative-feedback resistor R3 which extends from the output terminal of the comparator to its noninverting (+) input port. Resistor R3 coacts with the parallel or equivalent resistance of the combination of R and 0.001R connected to the noninverting input port of comparator 320 to provide hysteresis in the operation of the rapid charge comparator 320. Comparator 320 switches state when capacitor voltage $V_C$ makes a high-to-low transition at a voltage of $$V_C \cong V_r \left( \frac{R}{R + 0.001R} \right) \qquad 6$$

and switches again when capacitor voltage $V_C$ makes a low-to high transition at a voltage of $$V_C \cong V_r \left( \frac{RR_3}{RR_3 + 0.001R(R_3 + R)} \right) \qquad 7$$

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated.

Thus, a current source modulator (202; 302, 502) for providing power to radar transmitters is disclosed. The modulator (202; 302, 502) comprises a power supply (210, 310, 510) operable to provide a known current to a storage capacitor (145) when enabled. A comparator circuit (220) is operable to provide a signal (V220) when a voltage ($V_C$) across the storage capacitor (145) is determined to be below a reference voltage (Vh, Vr); and an enable circuit (225) is operable to receive the comparator signal (V220) and the command signal (On Command) and to provide an enable signal to the power supply (210, 310, 510). The modulator (202, 302, 502) further comprises a network (220N) associated with the comparator circuit (220) operable to retain the value of the signal (provide hysteresis) when the voltage across the storage capacitor is above the reference voltage. In another aspect of the invention, the modulator (202, 302, 502) includes a second network (320N) associated with a second comparator circuit operable to retain a second signal when the voltage ($V_C$) across the storage capacitor (145) is above the reference voltage ($0.999 V_r$). In this aspect, there is a rapid charge and a trickle charge that reduces any charging overshoot.

What is claimed is:

1. A current source modulator operable to generate a transmit pulse substantially concurrently with a command signal, comprising:
   a power supply operable to provide a known current to a storage device when enabled;
   a comparator circuit operable to provide a signal when a voltage across said storage device is determined below a determined voltage;
   an enable circuit operable to receive said signal and said command signal and provide an enable signal to said power supply; and further comprising:
   a network associated with said comparator operable to retain said signal when said voltage across said storage device is above said determined voltage.

2. The modulator as recited in claim 1, wherein said network is a feedback resistor network.

3. The modulator as recited in claim 1, wherein said network is a regenerative network.

4. A current source modulator, operable to generate a transmit pulse substantially concurrently with a command signal, comprising:
   a power supply operable to provide a known current to a storage device when enabled;
   a first comparator circuit operable to provide a signal when a voltage across said storage device is determined below a determined voltage; and
   an enable circuit operable to receive said signal and said command signal and provide an enable signal to said power supply, said current source modulator further comprising:
   a second comparator circuit operable to provide a second signal when said voltage across said storage device is determined below a known level of said determined voltage; and
   a network operable to receive said second signal and reduce said known current by a known amount.

5. The modulator as recited in claim 4, further comprising:
   a second network associated with said second comparator circuit operable to retain said second signal when said voltage across said storage device is above said reference voltage.

6. The modulator as recited in claim 5, wherein said second network is a feedback resistor network.

7. The modulator as recited in claim 2, wherein said network comprises:
   a switch device; and
   a resistive network.

8. The modulator as recited in claim 1, wherein said command signal is inactive for a period of time greater than a duration of said pulse.

9. A current source modulator operable to generate a transmit pulse substantially concurrently with a command signal, comprising:
   a power supply operable to provide a known current to a storage device when enabled;
   a comparator circuit operable to provide a signal when a voltage across said storage device is determined below a determined voltage; and
   an enable circuit operable to receive said signal and said command signal and provide an enable signal to said power supply, and further comprising:
   a voltage regulator operable to monitor an output of said power supply and provide a signal to said power supply; and
   a switch operable to disengage said voltage regulator.

10. The modulator as recited in claim 1, wherein the storage device is a capacitor.

11. A method for reducing power supply noise during the duration of a pulse transmission comprising the steps of:
    monitoring a level of voltage across a voltage storage device; and
    disengaging said power supply when said voltage falls below a known value in conjunction with a command signal operating at substantially the rate of pulse transmission.

12. The method as recited in claim 11 further comprising the step of:
    altering a charging rate of said voltage storage device when said voltage across said voltage storage device is greater than a second known value.

13. The method as recited in claim 11 wherein said command signal has a pulse duration greater than said pulse transmission duration.

14. The method as recited in claim 12 wherein said second known value is determined in relation to said known value.

15. A method for reducing power supply noise resulting from a transmission pulse, said method comprising the steps of:
    applying a command signal to a transmitter for commanding pulse transmissions;
    monitoring a level of voltage across a voltage storage device coupled to said transmitter; and
    disengaging said power supply when said voltage falls below a known value in conjunction with said command signal.

* * * * *